US012604452B2

(12) United States Patent
Lin et al.

(10) Patent No.: US 12,604,452 B2
(45) Date of Patent: *Apr. 14, 2026

(54) COMPACT ELECTRICAL CONNECTION THAT CAN BE USED TO FORM AN SRAM CELL AND METHOD OF MAKING THE SAME

(71) Applicant: Taiwan Semiconductor Manufacturing Co., Ltd., Hsinchu (TW)

(72) Inventors: Yu-Kuan Lin, Hsinchu (TW); Kuo-Yi Chao, Hsinchu (TW); Chang-Ta Yang, Hsinchu (TW); Mei-Yun Wang, Hsinchu (TW); Ping-Wei Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 299 days.

This patent is subject to a terminal disclaimer.

(21) Appl. No.: 18/193,557

(22) Filed: Mar. 30, 2023

(65) Prior Publication Data

US 2023/0240060 A1     Jul. 27, 2023

Related U.S. Application Data

(63) Continuation of application No. 16/854,770, filed on Apr. 21, 2020, now Pat. No. 11,621,267, which is a
(Continued)

(51) Int. Cl.
*H10B 10/00*         (2023.01)
*G11C 11/412*        (2006.01)
(Continued)

(52) U.S. Cl.
CPC ............ *H10B 10/12* (2023.02); *G11C 11/412* (2013.01); *H01L 21/76895* (2013.01);
(Continued)

(58) Field of Classification Search
None
See application file for complete search history.

(56) References Cited

U.S. PATENT DOCUMENTS

| | | | |
|---|---|---|---|
| 6,274,409 B1 | 8/2001 | Choi | |
| 2003/0127752 A1 | 7/2003 | Kim et al. | |

(Continued)

FOREIGN PATENT DOCUMENTS

| | | |
|---|---|---|
| CN | 107026201 A | 8/2017 |

*Primary Examiner* — Nilufa Rahim
(74) *Attorney, Agent, or Firm* — Seed IP Law Group

(57) ABSTRACT

An integrated circuit structure in which a gate overlies channel region in an active area of a first transistor. The first transistor includes a channel region, a source region and a drain region. A conductive contact is coupled to the drain region of the first transistor. A second transistor that includes a channel region, a source region a drain region is adjacent to the first transistor. The gate of the second transistor is spaced from the gate of the first transistor. A conductive via passes through an insulation layer to electrically connect to the gate of the second transistor. An expanded conductive via overlays both the conductive contact and the conductive via to electrically connect the drain of the first transistor to the gate of the second transistor.

20 Claims, 13 Drawing Sheets

Related U.S. Application Data continuation of application No. 15/896,499, filed on Feb. 14, 2018, now Pat. No. 10,651,178.

(51) Int. Cl.

| | | |
|---|---|---|
| *H01L 21/768* | (2006.01) | |
| *H01L 23/522* | (2006.01) | |
| *H10D 30/01* | (2025.01) | |
| *H10D 89/10* | (2025.01) | |

(52) U.S. Cl.

CPC ......... *H01L 23/5226* (2013.01); *H10B 10/18* (2023.02); *H10D 30/021* (2025.01); *H10D 89/10* (2025.01)

(56) References Cited

U.S. PATENT DOCUMENTS

| | | | |
|---|---|---|---|
| 2004/0005755 A1 | 1/2004 | Moniwa et al. | |
| 2008/0210990 A1 | 9/2008 | Lim | |
| 2012/0104471 A1 | 5/2012 | Chang et al. | |
| 2013/0161722 A1 | 6/2013 | Son et al. | |
| 2014/0035048 A1 | 2/2014 | Lee et al. | |
| 2014/0241027 A1 | 8/2014 | Hung et al. | |
| 2015/0221642 A1 | 8/2015 | Liaw | |
| 2017/0148727 A1 | 5/2017 | Do et al. | |
| 2018/0261604 A1 | 9/2018 | Woo et al. | |
| 2018/0286957 A1* | 10/2018 | Bae ...................... | H10D 64/258 |
| 2018/0294256 A1 | 10/2018 | Lee et al. | |
| 2019/0214387 A1 | 7/2019 | Holt et al. | |
| 2019/0237542 A1* | 8/2019 | Chen ................... | H10D 62/113 |

* cited by examiner

COMPACT ELECTRICAL CONNECTION THAT CAN BE USED TO FORM AN SRAM CELL AND METHOD OF MAKING THE SAME

BACKGROUND

Microprocessors which include in the same family micro-controllers, ASICs and various chips having one or more CPUs on a single die, frequently include a block of SRAM. When a block of SRAM is included on a microprocessor, some of the process steps carried out in making the micro-processor can also be used to make the SRAM. To make this possible, the SRAM should be designed in such a way to be compatible with the process technology used in making the microprocessor. The different layers of material which are available while the microprocessor is constructed should be used in the SRAM cell. This presents different challenges than when manufacturing a stand-alone SRAM chip.

If the SRAM memory cell can be constructed using the same masks, materials, deposition process steps, insulation layers and other process technology used while making the microprocessor, then this saves the need to create special masks and process steps for structures that are inside the SRAM cell, while reduces the total masks needed for making the microprocessor chip as a whole.

DETAILED DESCRIPTION

Figure 1A:
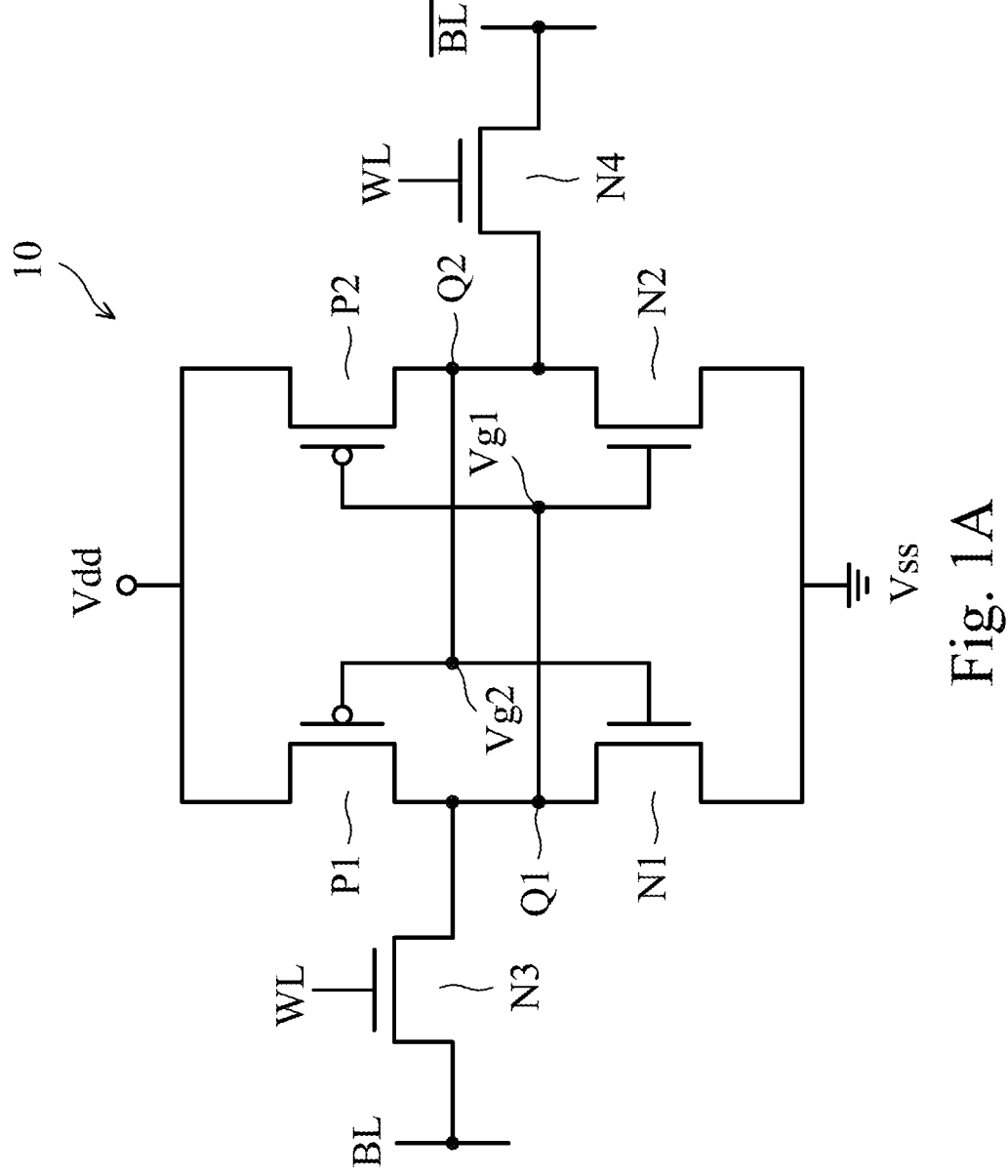
FIG. 1A is a circuit diagram of a 6T-SRAM cell.

FIG. 1A illustrates a circuit of an SRAM cell that is constructed according to the embodiments disclosed herein. The circuit elements and electrical connections for a 6T SRAM cell are well known in the art. Even though the circuit itself maybe known, there are many different layouts that can be used to achieve the circuit as shown in FIG. 1A. Disclosed herein in various embodiments is a compact layout for the SRAM cell circuit of FIG. 1A. This compact cell is compatible with a microprocessor being made by the same process in the same semiconductor chip. In some embodiments, the same process steps which are used to manufacture a microprocessor can be used in making the SRAM cell as disclosed herein that will result in the circuit as shown in FIG. 1A. No additional masks are needed beyond those used in making the microprocessor. In addition, those masks which are used in making a microprocessor have a selected shape in the embedded SRAM memory portion of the semiconductor chip in order to achieve the layout and structure as disclosed herein. An explanation of the circuit connections and operation of SRAM cell is beneficial as will now be provided.

As shown in FIG. 1A, the SRAM cell 10 has a total of six transistors. These include two P-channel transistors, P1 and P2, and two N-channel transistors, N1 and N2. These four transistors are connected as cross-coupled inverters in order to store data at the data nodes Q1 and Q2. The data node Q1 is connected to the gates of the P2 and N2 at node $V_{g1}$ and the data node Q2 is connected to the gates of P1 and N1 at node $V_{g2}$. Access transistor N3 is connected to data node Q1 at one terminal and to the bit line at the other terminal. Access transistor N4 is connected to data node Q2 at one terminal and to at its other terminal. A word line enables transistors N3 and N4 in order to provide access of the bit lines to the data nodes Q1 and Q2. The access of the bit lines to the data nodes Q1 and Q2 can be provided in order to store data at the data nodes or, alternatively, to read data from these data nodes. The source of transistors P1 and P2 are tied together and connected to VDD. The source of transistors N1 and N2 are connected together and tied to VSS. The drains of P1 and N1 are connected to each other, while the drains of P2 and N2 are connected to each other. This particular circuit structure as shown in FIG. 1A acts as an SRAM cell to permit the writing and reading of data to and from nodes Q1 and Q2 using control systems. \x \to (BL)

Figure 1C:
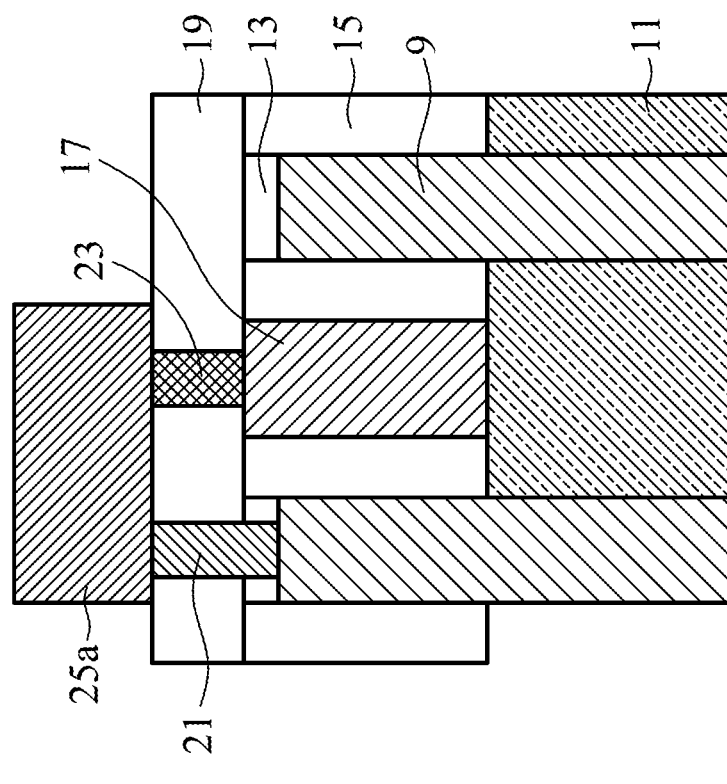
FIG. 1C is a cross-section taken along lines 1C-1C of FIG. 1B.
Figure 1B:
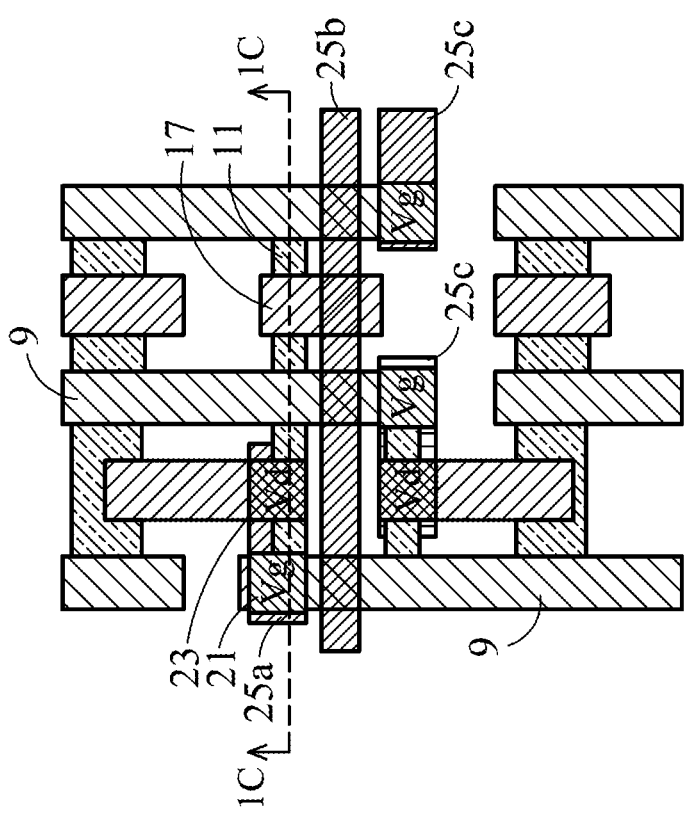
FIG. 1B is a top side view of a prior layout of an SRAM cell.

FIGS. 1B and 1C illustrate some portions of a 6T cell using a layout and techniques of the prior art. An active area 11 is overlaid by various gate structures 9. Various electrical insulating layers 15 form electrical isolation around each gate structure 9. These layers may include interlevel dielectric layers, passivation layers and various layers of insulating material. Overlaying the gate structure is a gate insulator 13, made of appropriate electrical insulating layers compatible with the semiconductor process technology. An electrical contact 17 is made to the active area. The electrical contact 17 provides the contact to the node Q1 or Q2 within the cell between the active area and the various other circuit elements in the SRAM cell. An electrical insulation layer 19 overlays the gate structure as well as the contact 17. Using various masks and etching techniques, an opening is formed in the insulation layer 19 and then in the gate insulator 13 in order to provide a via to selected locations of the gate structure. A via 21 is formed that extends through both the insulation layer 19 and the gate insulator 13 in order to contact various gate structures 9 at selected locations in the cell. At other locations in the insulation layer 19, openings are formed to active area contact 17 and a via 23 is formed therein which electrically connects to the contact 17. Overlying the insulation layer 19, a conductive layer 25, e.g., a metal layer, is blanket deposited and then masked and etched in order to create conductive interconnection lines 25a, 25b, and 25c which electrically connect to different nodes in the SRAM cell. This same conductive layer 25 is used to connect to both the active area contact 17 as well as to the gate via 21 at various locations in the cell. In addition, the conductive layer 25 is also used to electrically connect to different circuit nodes within an SRAM cell and to connect the cells to each other. For example, an interconnection strip 25b of the same conductive layer 25a extends through the central region of the SRAM cell. Further, other portions 25c also make electrical connection to various nodes in the SRAM cell.

A particular disadvantage of the publicly known layout and structure is that to electrically connect the metal layer 25 to the active area requires a double stack of contact and vias 17 and 23. Whenever vias are stacked on top of each other or on contacts, mask alignment errors can occur and additional tolerances need to be built into the mask alignment, which tends to increase the size of the memory cell layout. In addition, the same metal layer 25 is used to make the structures 25a, 25b and 25c. This creates a metal-to-metal spacing which is very small in the same plane since each portion of the metal layer 25 overlays the insulation layer 19. If an attempt is made to make the memory cell more compact, the various metal strips 25a, 25b and 25c become very close to each other, which risks shorting them to each other if there are any discontinuities in the electrical isolation between them. In addition, when two metal layers are closely adjacent to each other, with a dielectric between them, it creates a capacitor. As the memory cell size shrinks, the different conductive strips of layer 25, shown here as 25a, 25b and 25c become closer and closer to each other, which significantly raises the capacitance of the memory cell, which slows down its operation and may interfere with the long term storage of data therein.

Figure 2B:
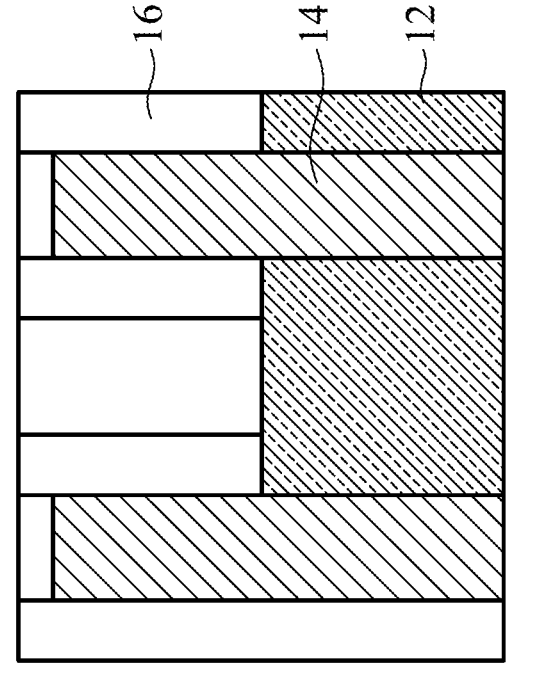
FIG. 2B is a cross-section view taken along lines 2B-2B of FIG. 2A.
Figure 2A:
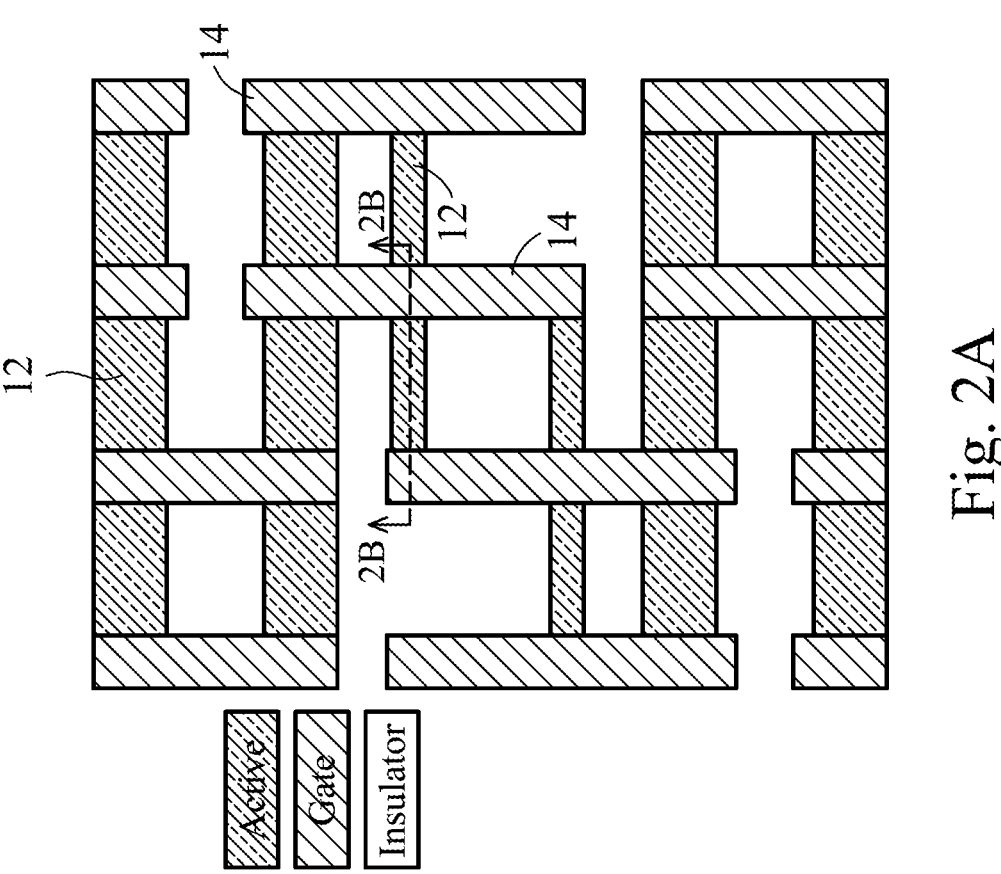
FIG. 2A is a top side view of the layout of the portions made in the first steps of manufacturing an SRAM cell according to the disclosure as provided herewith.

FIGS. 2A and 2B illustrate a layout and first set of steps in the manufacture of an SRAM cell according to principles as taught herein in various embodiments. An active area 12 includes a semiconductor material. The active area 12 can be made of silicon, silicon-germanium, or other acceptable combinations of semiconductor material. In one embodiment, the active area 12 includes a Fin structure to create a FinFet transistor. A gate 14 overlays the active area 12 at selected locations where transistors are to be formed. The gate 14 is made of an acceptable metal, and a gate insulator is positioned between the active area 12 and the gate 14. The gate insulator may include hafnium oxide, and in some embodiments, may include a silicon dioxide, silicon nitride or other insulators. The material for the gates may include molybdenum, titanium, titanium-nitride, tantalum, aluminum, as well as various other metals and metal alloys which are selected based on the desired work function of the gate layers that are used in the transistors being formed.

An electrical insulating structure 16 is overlaid on the active area 12, the gate structures 14, as well as in between the gate structures. The insulation material 16 may include multiple layers as well as various spacers, and other acceptable layers of electrical isolation. The insulation material 16 can be formed of silicon dioxide, silicon nitride or other suitable electrical insulation layers compatible with semiconductor processing technology. In some embodiments, the insulating material 16 include numerous different layers and sublayers of different types of insulating material in order to perform electrical isolation between the various structures. The various insulating layers are used in the formation of microprocessors on a semiconductor chip and those insulating layers which are used in the formation of the microprocessor circuits, including the CPU, the logic, and other transistors can be deposited in the location of the SRAM cell in order to form the insulation material 16.

Figure 3B:
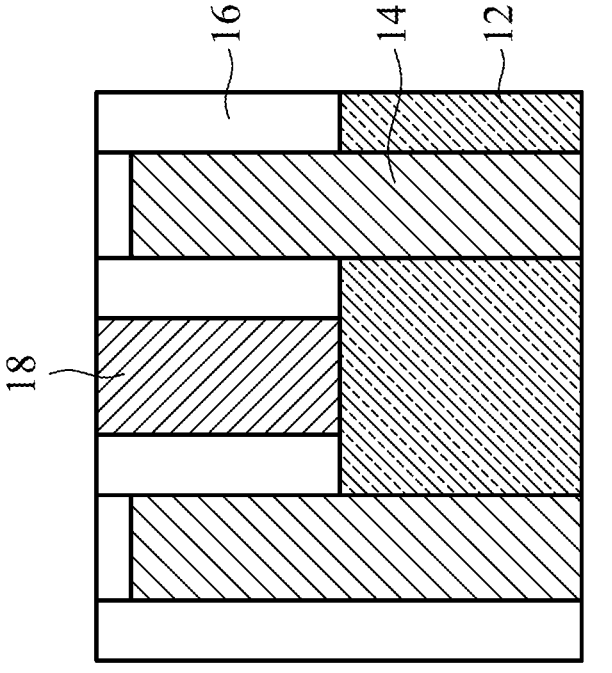
FIG. 3B is a cross-section view taken along lines 3B-3B of FIG. 3A.
Figure 3A:
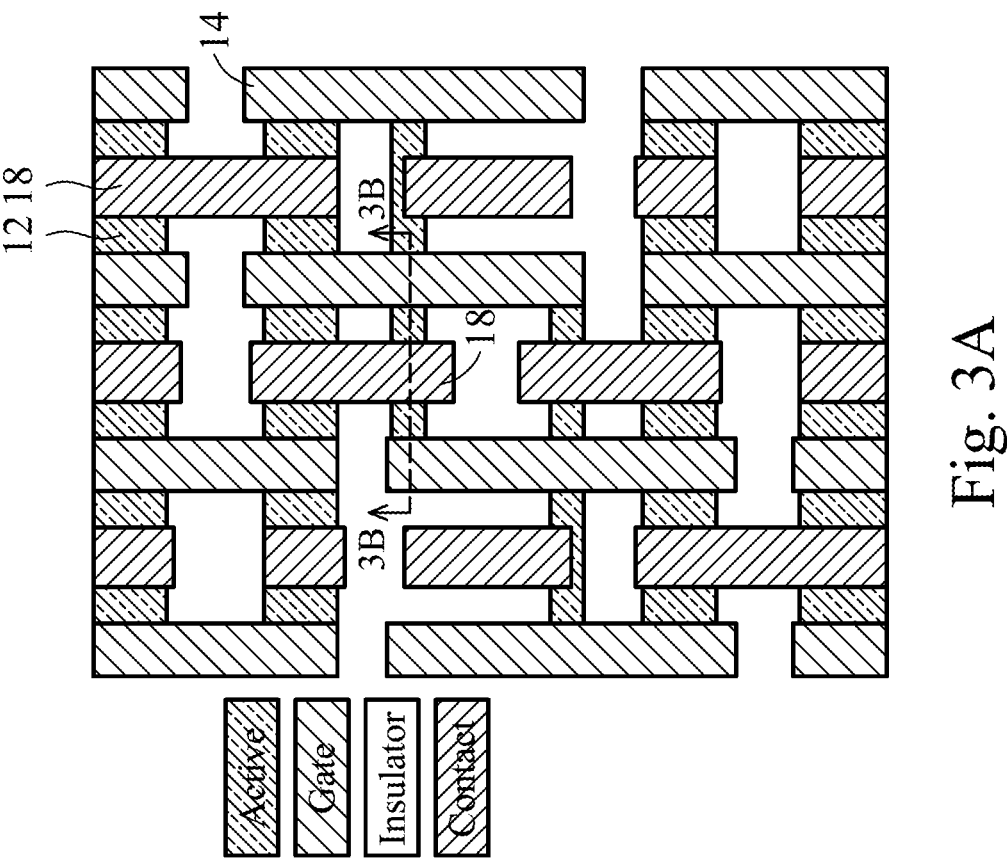
FIG. 3A is a top side view of the layout of the next steps in manufacturing the SRAM cell according to the embodiments disclosed herein.

Shown in FIGS. 3A and 3B, a contact is formed through the insulating structure 16 to the active area 12. This contact 18 is formed by etching openings at selected locations in the insulating material 16 and forming a contact using known techniques. In one embodiment, the contact 18 is a tungsten plug which is formed using a Ti and/or TiN liner deposited into the opening, followed by blanket tungsten deposition and etch-back in order to form the contact 18. The structure after forming the formation of the contact 18 is shown in FIGS. 3A and 3B.

In one embodiment, after the structure of FIG. 3B is formed, a sealing layer, such as Ti or TiN is blanket formed over entire exposed structure. This provides the sealing layer over the exposed surface of the contact 18 and the the insulation structure 16.

Figure 4B:
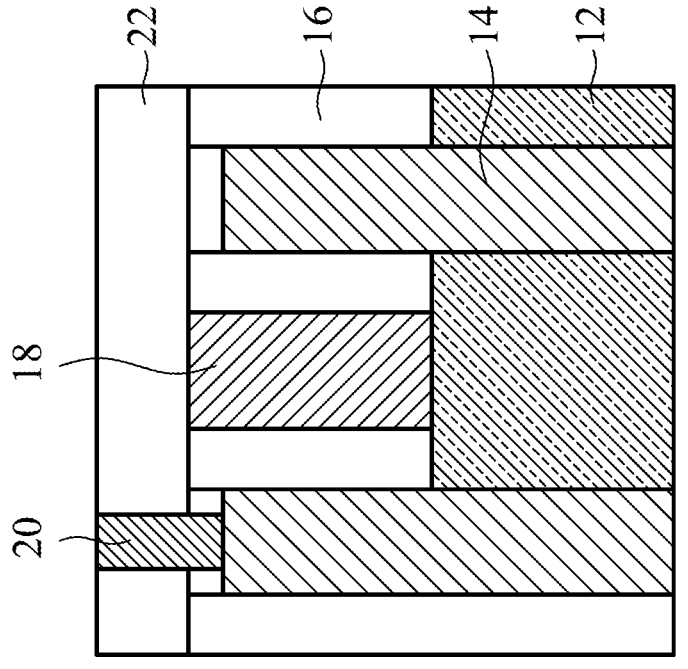
FIG. 4B is a cross-section view taken along lines 4B-4B of FIG. 4A.
Figure 4A:
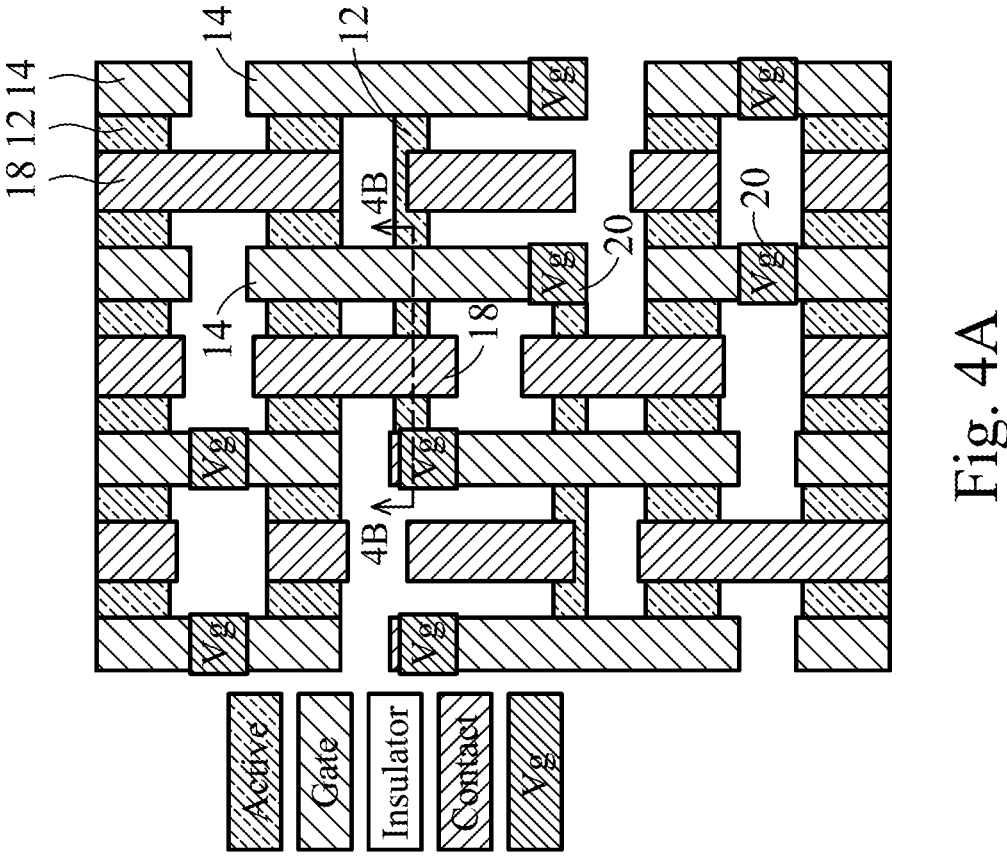
FIG. 4A is a top side view of the layout of the next steps in manufacturing the SRAM memory cell according to the embodiments disclosed herein.

FIGS. 4A and 4B show the next steps in the process according to various embodiments as disclosed herein. A blanket insulation layer 22 is formed on the entire structure, overlaying the insulation material 16, as well as the contact 18 and the gates 14. This layer 22 is formed as a blanket deposition. It may be followed by planarizing etch-back, usually in the form of CMP. The insulation layer 22 can be made of any acceptable material, including silicon nitride, silicon oxide, or any acceptable dielectric.

An opening is made in the insulation layer 22 in order to form a via to the metal gate 14. The opening in insulation layer 22 is made by a photoresist deposition mask and etch process, and, in some embodiments, using an anisotropic etch such as a reactive ion etch. The etch is carried out to etch through the upper portion of insulating structure 16 to expose the gate 12. In those instances in which the insulation layer 22 and the insulation structure 16 are made of different materials, the etch chemistry may be changed during the etch process in order to etch the different respective layers, such as silicon oxide, silicon nitride, or other materials which may be present in the layers 22 and 16. In the embodiment in which a sealing layer, such as Ti or TiN are provided over the insulation structure 16, the etch of layer 22 can be carried until the sealing layer is reached, at which time the etch chemistry is changed to etch the sealing layer at the location that corresponds to the via 20, and once it is removed at that location, the etch chemistry is changed again to etch through the insulation structure 16 until the gate 14 is reached. The etch can be carried out as either a timed etch or using an etch which does not etch the gate material 14 so the gate material 14 acts as an etch stop layer. The etching is carried out until an upper layer of the gate structure 14 is exposed. A conductive via 20, e.g., a metal via, is formed in the opening in the layer 22 and structure 16 to provide electrical contact to the metal gate 14. The via may be made using any acceptable technique, such as a tungsten plug with a Ti and/or TiN liner and the like.

Figure 5B:
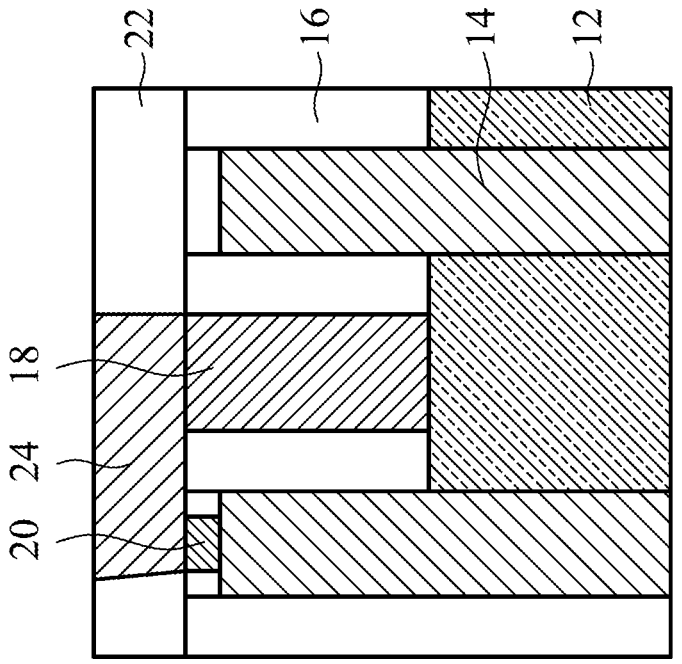
FIG. 5B is a cross-section view taken along lines 5B-5B of FIG. 5A.
Figure 5A:
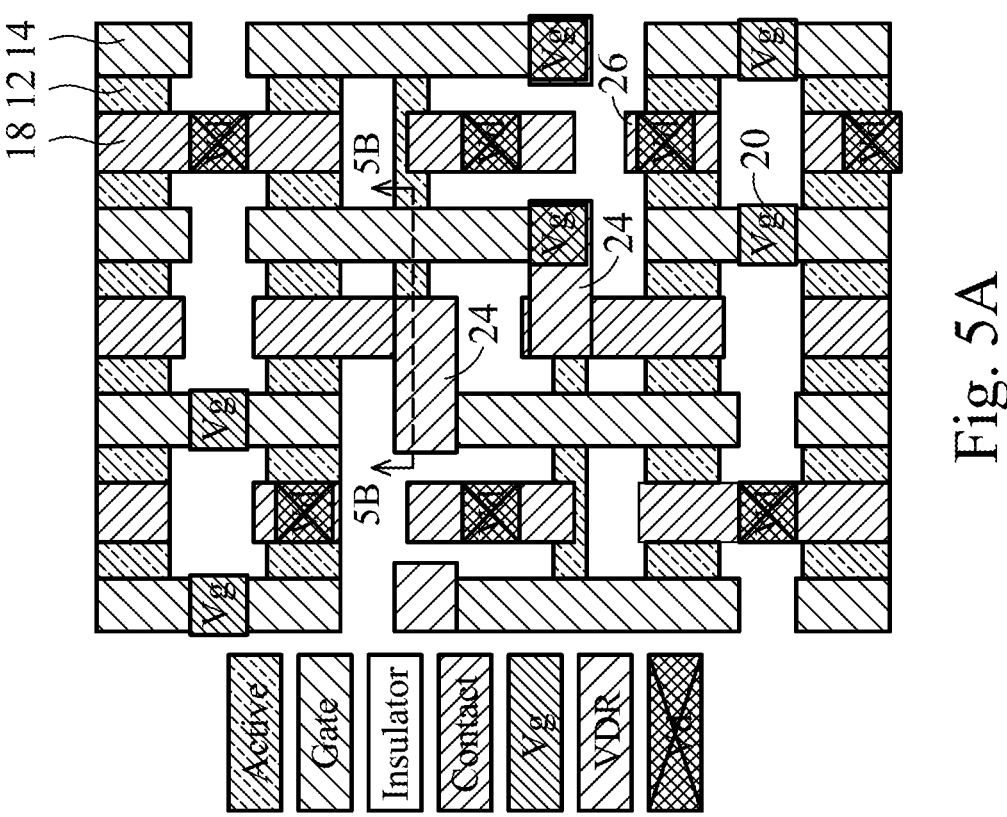
FIG. 5A is a top side view of the layout of the next steps in manufacturing the SRAM memory cell according to the embodiments disclosed herein.
Figure 5C:
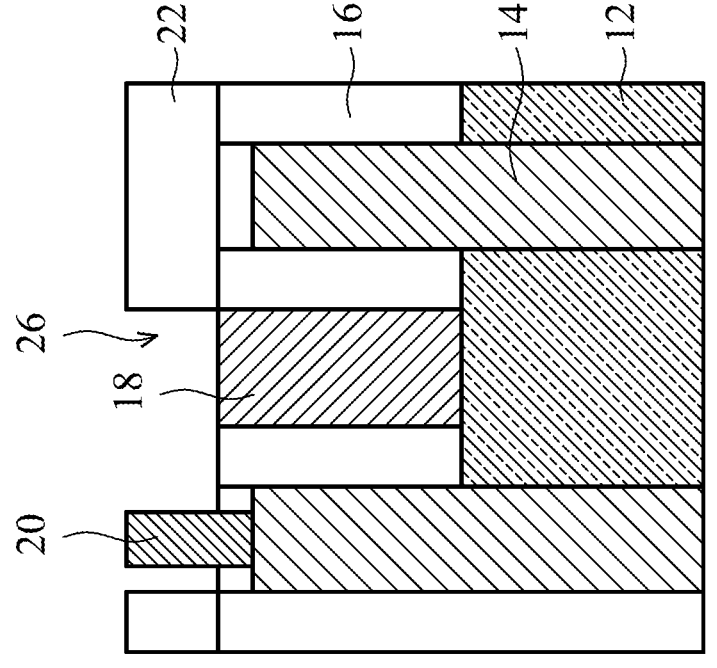
FIG. 5C is a cross-section view taken along line 5B-5B of FIG. 5A at a different stage of the process.

FIGS. 5A, 5B, and 5C illustrate steps in the sequence of the formation of the SRAM cell according to the embodiments disclosed herein. After the via 20 has been formed, with the metal deposited therein, a subsequent mask and etch is carried out on the same insulation layer 22. This subsequent mask and etch creates a larger opening 26 in the insulation layer 22 which completely overlays the opening previously made in the prior step for the via 20. In addition, the opening is sufficiently large to extend from the via 20 to the contact 18. In some embodiments, as shown in FIG. 5C, the opening 26 in the insulation layer 22 extends to completely include all of the area of the via 20 as well as to include the area of the contact 18 that was previously formed in a prior step. This is sufficiently large to extend between two or more vias and contacts. The opening in the insulator 22 is then filled with a metal material in order to form the expanded via 24. The via 24 is considered an expanded via because it is sufficiently large to link together, electrically and mechanically, two adjacent vias, two adjacent contacts, or an adjacent contact and via. The expanded via 24 fully encompasses at least two vias and/or contacts which were previously formed in the same layer or prior layers.

As can be seen in FIGS. 5B and 5C, the via 24 extends to overlay the via 20 as well as the contact 18, as well as the material between these two structures. The via 24 therefore acts as an interconnecting via which electrically connects two vias together or, in some instances, a via to a contact.

The opening for the via 24 is made in the same insulating layer 22 in which a via was previously formed, and thus can be considered a double layer via. It also includes the area of the previously formed via as well as the area of contacts or vias underneath the insulating layer 22.

As shown in FIG. 5C, the opening 26 for the via 24 to be made in layer 22 is formed using the appropriate masks and etch chemistry for the particular materials. For example, if the insulating layer 22 is made of silicon dioxide and silicon nitride combinations, a photoresist mask provides a pattern corresponding to the shape of via 24, after which sequential etches are carried out to completely remove the insulation material in layer 22 to form opening 26 to expose the contact metal 18. In addition, an etch chemistry is used that will etch away and remove the metal of via 20.

Various different techniques can be used to form the opening 26, as shown in FIG. 5C. Different embodiments will now be described, any one of which is acceptable for forming the opening 26 which exposes the contact 18 as well as the via 20 to prepare the material for the deposition of the metal for the via 24. In some embodiments, the metal for the contact 18 and the via 20 will be the same metal, and both will be etched by the same etch chemistry. In other embodiments, the metal for the contact 18 and the metal for via 20 may be different and exhibit different etching rates for a given etchant, and thus permit one to be selectively etched with respect to the other. For example, the metal for contact 18 may be etched by an etchant that is not an effective etchant of the metal for via 20 or etches the metal for via 20 at a significantly different rate than it etches the metal for contact 18. Alternatively, the contact 18 may have an upper layer of a different material that acts as an etch stop. Thus, various types of etch chemistry and etch steps can be carried out, as will now be described for different embodiments.

According to one embodiment, the etching is carried out using the metal 18 as an etch stop indication layer, such that when the metal 18 is exposed during the etch process, that this indicates an end of etch. This particular technique is beneficial when an upper layer of contact 18 is a different material than via 20. After the metal on the top of contact 18 has been exposed, then the etch continues for a brief period of time in order to remove any debris, stringers, or isolated insulation over the metal 18, so that it is clear of all electrical insulation so that good electrical contact can be made between the via 24 and the contact 18. After this electrical insulation material has been removed, the metal that comprises the via 20 is then etched with an etch chemistry that is selected to remove the metal of via 20 but not remove the insulation material 22, 16, or the top layer of contact 18. For example, an etch chemistry that is selective to remove tungsten but not remove silicon dioxide, silicon nitride, Ti, or TiN can be used to remove the metal 20 until is it flush with the upper layer of electrical insulation layer 22.

According to one embodiment, after the structure shown in FIG. 3B has been formed, a blanket sealing layer is deposited over the insulator 16 and the contact 18. The blanket metal layer may be a sealing layer of titanium, titanium nitride, tantalum, molybdenum, or some other material which can seal the tungsten of material 18. In some embodiments, the deposited material is an etch stop to the insulation layer 22. Namely, an etch chemistry which etches the insulation layer 22 does not etch the sealing layer. Thus, in one embodiment, an additional sealing layer is applied on top of the insulation material 16 and the contact 18.

According to this embodiment, a sealing layer is present overlying the insulation material 16 and the contact 18 having been deposited on top of the structure of 3B. The opening is etched through insulation material 22 until the sealing layer is reached, the sealing layer being an etch stop layer that is not etched with the same etch chemistry that etches the insulation layer 22. Since the sealing layer extends completely across the top surface of insulation structure 16 and the contact 18, it prevents etching of the insulation structure 16 and contact 18 to achieve an approximately planar top surface, as shown in FIG. 5C using the etch chemistry that etches layer 22. Thus, the sealing layer being blanket deposited on the structure as shown in FIG. 3B provides the benefit of obtaining a substantially planar top surface for both the contact 18 and the insulation structure 16 when carrying out the etch of insulation layer 22. At this stage, the material of the via 20 is exposed on all sides, since the opening 22 is sufficiently large to leave the metal of via 20 as a pillar in the middle of the opening as shown in FIG. 5C.

FIG. 5C illustrates the process step between 4B and 5B. In particular, as shown in FIG. 5C, an opening has been etched in insulation layer 22 to expose the upper portion of contact 18. In one embodiment, previously described, the opening 26 etches to stop on an etch stop layer which overlies the conductive contact 18, e.g., a metal contact, and also overlies the insulation layer 16. Namely, the etch continues to remove all the material of the opening 26 through the insulation layer 22 until the etch stop layer which overlies the insulation layer 16 is reached. Since this is a layer that is not etched by the same etch chemistry that etches the insulation layer 22, the etching can continue until the material 22 is fully removed from the opening 26.

As also shown in FIG. 5C, the via 20 is fully exposed, because the opening 26 extends slightly to the other side of the via metal 20 to ensure that full contact can be made to the entire area of via 20. The amount of extension past the via 20 may be small, but some small extension is provided to account for tolerances and mask alignment to assure that the full structure of via 20 is exposed for later removal.

Figure 6B:
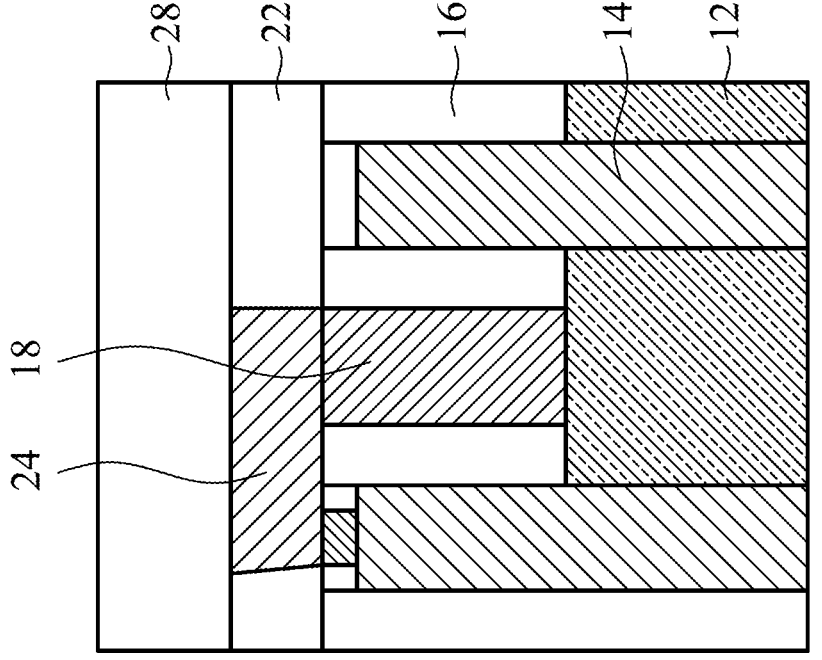
FIG. 6B is a cross-section view taken along lines 6B-6B of FIG. 6A according to one embodiment.

In one embodiment, when the opening 26 has been formed, the metal for via 24 is next deposited. This will merge with the remaining metal of via 20 to form a single large via 24. Since it has merged with the via 24 outside of the opening in the insulation layer 16, they are now shown as a single integrated piece of metal. The deposition of the metal into the opening 26 will continue to overfill the hole, after which a CMP is carried out the planarize the surface as shown in FIGS. 5B and 6B.

In a different embodiment, subsequent to the structure shown in FIG. 5C, the via 20 is etched to be in a substantially at a same level with the contact 18 and the upper surface of insulation layer 16. This etch can be carried out by a number of techniques. According to a first embodiment, the material used for the via 20 is selectively etchable with respect to the material used in the etch stop layer over the insulation structure 16 and contact 18. For example, the material of via 20 may be tungsten, molybdenum, or other metal which is selectively etchable with respect to Ti or TiN. Thus, in one embodiment, the contact 18 is comprised of tungsten, the sealing layer is comprised of Ti and/or TiN, and the via 20 is comprised of a metal which is selectively etchable with respect to the sealing layer. Accordingly, in this embodiment, the material 20 is etched until it is planar with respect to the upper surface of the sealing layer on insulator 16.

It is also permissible for the layer 20 to be slightly over-etched. As can be seen in FIG. 5B, the subsequent material deposited for the via 24 will completely fill the entire opening 26. Accordingly, if the material 20 is slightly over-etched to have an upper surface that is slightly below the insulator material 16, this is acceptable, since the material of the via metal 24 will completely fill any opening, and make full electrical contact.

According to one embodiment, the material of the contact 18 and the via 20 are the same material; for example, tungsten, or other suitable material. In one embodiment, an etch stop layer has been previously deposited overlying the contact 18. This was deposited subsequent to the step as shown in FIG. 3B, as previously described. In this embodiment, the uppermost surface of contact 18 is covered by an etch stop layer that is not etchable with the same etch that would etch the material of layers 20 and 18. This etch stop material can be, for example, Ti, TiN, Ta, or the like. With the protective layer overlying the contact 18, the material 20 is etched with a timed etch until it is substantially flush with the upper surface of material 16, as previously described. After this, an etch is carried out to selectively etch away the etch stop layer while not etching the material of layers 20 and 18. For example, an etch is carried out that will selectively etch away Ti or TiN but does not etch tungsten. This will therefore expose the uppermost surface of the contact 18 for the subsequent deposition of via 24.

As a further alternative, the etch stop layer can be left in place, and never etched. Ti and TiN are highly conductive metals and therefore the via material 24 can be deposited directly onto the etch stop layer if it is composed of Ti or TiN, and good electrical connection made through the etch stop layer to the contact 18. In this embodiment, with Ti or TiN as a blanket layer across the entire bottom of opening 26, a highly conductive surface is available for the deposition of tungsten. Since the goal is to have a low-resistance contact to the contact 18, having the etch stop layer of metal extend across the entire bottom surface of the opening 26, including on the upper surface of the insulating structure 16, provides additional area for electrical contact, and further increases the conductivity and thus provides further benefits.

In some embodiments, an etch stop layer will not be used over the contact 18 when it is comprised of tungsten, and therefore tungsten will be exposed flush with the upper surface of insulating structure 16. Even if a Ti or TiN liner is present in the bottom and side walls of the insulating structure 16, if a CMP or other etch is carried out, the exposed material of the contact 18 will be tungsten at the uppermost surface.

In some embodiments, it may be desired to have the tungsten of via 24 in direct mechanical and physical contact with the tungsten of contact 18. In such instances, any overlying layers over the contact 18 are removed, so that the tungsten of via 24 is directly deposited onto the tungsten of contact 18, thus providing a continuation of the same metallic structure which will have high conductivity and low likelihood of containing gaps or electrical discontinuities. The structure shown in FIG. 5B can be an embodiment in which the via 24 directly overlays the contact 18, and there is no intermediate metallic layer between the two. In this embodiment in which the material of the via 24 is the same metal, such as tungsten, as the contact 18 and the via 20, then all three materials of tungsten are in direct mechanical, physical, and electrical contact with each other, providing a low resistivity connection of the via 24 that couples the contact 18 to the via 20.

In the embodiment, in which the material of via 20 and the material of contact 18 are both made of the same metal; for example, tungsten, the following steps are carried out. After the opening 26 is etched as shown in FIG. 5C, in one embodiment, the material of via 20 is next etched sufficient to remove the upstanding material of via 20 above the top of insulator material 16 shown in FIG. 5C until the top of material of via 20 is flush with the insulator material 16. During this etch for this embodiment, the upper surface of contact 18 might also be etched away for a depth equal to the height of the material of via 20. This may, for example, be 15% or 20% of the height of the contact 18. In many instances, the insulator 22 will be about 15%, or in some cases 20%, of the height of the insulation material 16. Accordingly, the pillar of via 20 can be fully etched while at the same time approximately the upper 20% of contact 18 is also etched away, leaving a recess in the upper part of contact 20 equal to the height of the via 20 that extends above the material 16. After the upper region of contact 20 has been etched away to leave an upper surface flush with the top surface of insulating structure 16, then the etch is stopped. This can be carried out using a timed etch or other acceptable technique. Subsequently, the via 24 is deposited in the opening 26. When it is deposited, it will completely fill any removed portion of the contact 18 at the same time that it fills the opening 26. The material of via 24 in one embodiment is tungsten, which will fill any recesses, pockets, or over-etching which may have occurred in contacts 18 and via 20, while also fully filling the opening 26. After the tungsten fully fills the opening 26 and any recesses in 18 and 20, that may have occurred during the etch, it will extend above the top surface of layer 22. At this stage, an etch back is carried out to remove the excess material of layer 24 that is outside of the via. This can be a planarizing etch that is carried out on the combination of insulator layer 22 and via 24 in order to planarize the surface. A CMP etch can provide a full planarizing etch of the semiconductor structure at this stage to remove all via material 24 that is outside the opening 26, and results in the planarized upper surface as shown in FIG. 5B. Various embodiments of different processes that can be carried out to form the via 24, as shown in FIG. 5B, from the structure of FIG. 4B, have been disclosed. Any one of the various embodiments which have been described can be used or, alternatively, different process steps may also be used in order to achieve the via 24 which extends to overlap both contact 18 and the via 20 to electrically connect them to each other as shown in FIG. 5B.

Figure 6A:
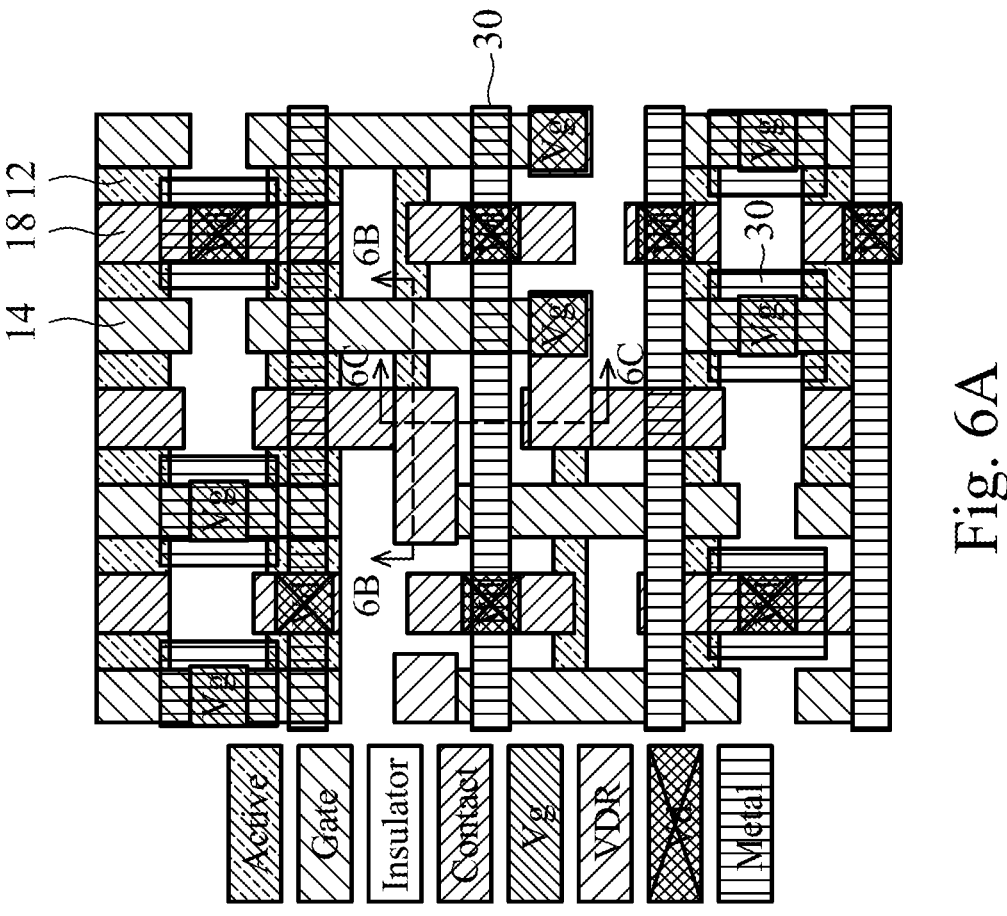
FIG. 6A is a top side view of the layout of the next steps in manufacturing the SRAM memory cell according to the embodiments disclosed herein.

FIG. 6A shows the insulation layer 28, which has been overlaid on the insulator 22 and the via 24. Subsequently, a metal layer 30 is either provide within or overlaid on the insulator 28, as show in FIGS. 6A, 6C, and 6D. The metal 30 is an interconnect wiring layer to electrically connect different portions of the circuit to various signal levels, voltage sources such as ground and power, and provide other interconnections between the circuit. Thus, the metal layer 30 is a wiring connection layer which is a distinctly different structure from the via structure as used for 24, 20.

In some embodiments, the metal interconnection layer 30 is made of a very low-resistivity metal, such as aluminum or, in one embodiment, copper. Since, Al and Cu have lower resistivity than tungsten or titanium, the use of Al and Cu for the wiring layer 30 provides a low resistance for connections between circuit components and to provide signals and power to various parts of the SRAM circuit. The wiring layer 30 will extend to portions of the microprocessor formed on the same die for a significant length to many different parts of the entire circuit, and therefore, using a lower resistance material such as Al or Cu is beneficial.

Figure 6D:
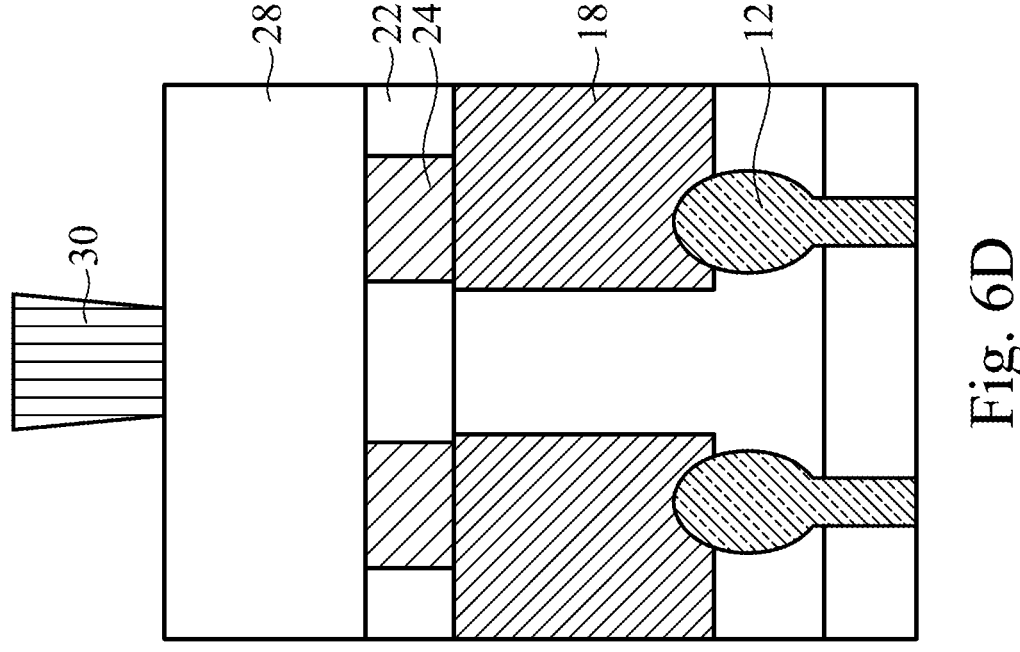
FIG. 6D illustrates an alternative embodiment in which a metal layer overlies an insulator layer.
Figure 6C:
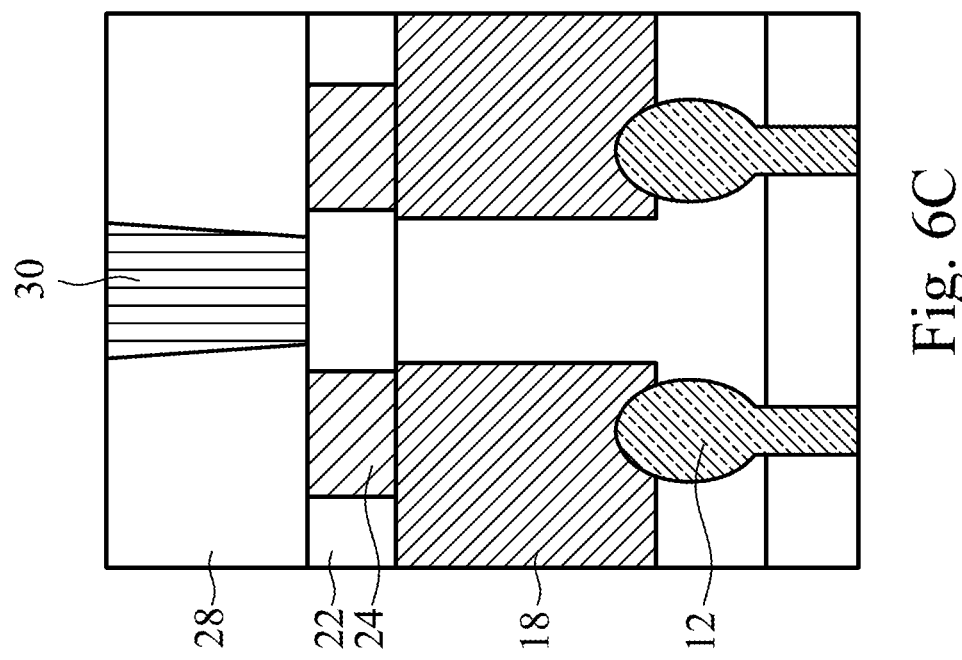
FIG. 6C is a cross-section view taken along lines 6B-6B of FIG. 6A, according to an alternative embodiment.

FIG. 6C is a cross section taken along the line 6C-6C shown in FIG. 6A. As can be seen, this cross section passes through two active areas 12 as well as through two contacts 18 and the metal wiring line 30. In a first embodiment, shown in FIG. 6C, a metal wiring layer is deposited on the insulation layer 22 and then is patterned and etch to obtain the metal strip 30 shown in FIG. 6C. After this, an insulation layer 28 is deposited on the the metal wiring layer 30. The insulation layer 28 is then etched to be planar with the top surface of the wiring layer 30. This can be done with CMP etch to planarize the entire structure or with any other acceptable etch to result in the structure shown in FIG. 6C. In an alternative method to obtain the structure of FIG. 6C, the insulation layer 28 is first deposited and then a recess is etched in insulation layer 28. After the recess is etched, the metal 30 is deposited into the recess to provide an embedded wiring line 30 in the layer. The wiring layer 30 extends to other electrical circuits and voltage sources in the semiconductor chip as previously described.

As can be seen, the metal 30 is spaced from both of the vias 24 sufficient to ensure that there is no electrical shorting or electrical contact between the metal 30 and either of the vias 24. In addition, it is a different plane, and therefore there is little or no capacitive coupling between the metal 30 and the vias 24. Accordingly, the problem of potential high capacitance is prevented, along with the potential for shorting or stray connections.

FIG. 6D illustrates an alternative embodiment in which the metal layer 30 is deposited overlying the insulator layer 28. In particular, in the alternative embodiment, a recess is not etched in the insulator 28, and instead the metal 30 overlies on top of the insulator 28, placing it even further from the via material 24.

Figure 7:
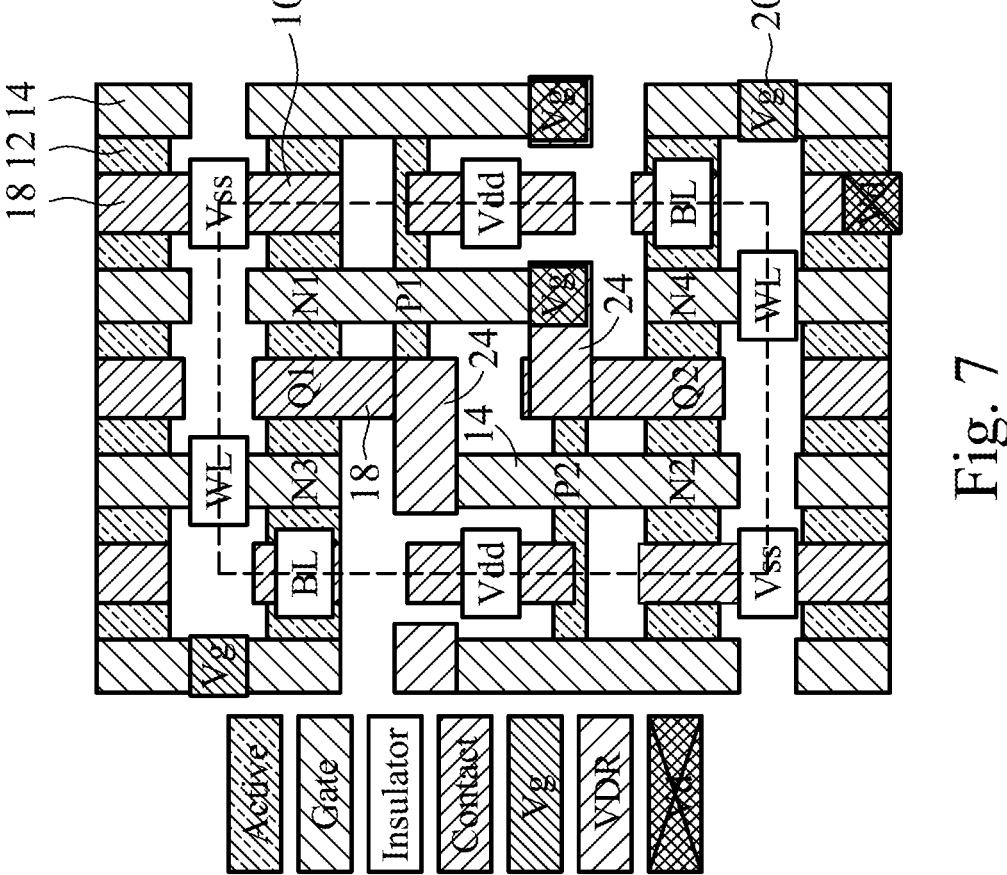
FIG. 7 is a top side view of the layout of an SRAM cell showing the various nodes in the circuit.

In the embodiment of FIG. 6D, even further protection is provided to ensure that the metal 30 cannot short to either of the vias 24, and also has even less capacitive coupling to vias 24. In the embodiment of FIG. 6D, the insulation layer 28 is deposited overlying the structure shown in FIG. 5B. After this, the metal 30 is deposited overlying the insulation layer 28. In some parts of the circuit, for example where the microprocessor is being formed, openings may be provided in insulation layer 28 in order to provide electrical contact between adjacent vertical layers. Thus, the wiring layer 30 will electrically contact conductive layers below it at some locations in the microprocessor structure. However, in the embodiment of FIG. 6D, an opening is not etched overlying the insulation layer 3 at the particular location of the cross section shown in FIG. 6A where it overlays the vias 24. In those locations, such as VD as shown in FIG. 6A, and VDD as shown in FIG. 7, where it is desired for the metal 30 to contact a conductor in a lower layer, an opening is etched of the type shown in FIG. 6C so that at that location the metal 30 is able to contact metal which is directly below it positioned within insulation layer 22. Either embodiment, FIG. 6C or FIG. 6D, may be carried out depending on the design of the particular mask used at that time in the process when forming the microprocessor structure.

After the structure of FIG. 6C or 6D is formed, additional layers are formed overlying the insulator layer 20 and the metal layer 30, which may include several additional layers of electrical insulation and wiring layers, along with the appropriate vias, to connect the various wiring layers to each other.

In particular, as the other circuits for the microprocessor are constructed on the same semiconductor die, various layers of insulators with metal wiring layers on top of them will be repeatedly formed. Many microprocessors contain between 7 and 13 metal layers. Therefore the process of depositing insulating layers with metal layers between them may be continued for a number of additional steps above the structures shown in FIGS. 6A-6D.

The present process has significant benefits when being used in conjunction with forming a microprocessor in other parts of the same semiconductor chip. In particular, the formation of the microprocessor has process steps that result in the formation of numerous contacts identical to contact 18, vias identical to via 20, and vias corresponding to via 24. Thus, in the same process steps in which these various insulation materials 16 and 22 are formed in the microprocessor section of the chip to connect logic circuits, these layers are formed and etched in the SRAM cell. Similarly, when the respective contacts and vias are formed in the microprocessor section, the identical process steps are carried out to form the contacts 18 in the various SRAM cells. When a corresponding via 20 is formed in the microprocessor section, the mask, etch, and depositions are carried out to form the via 20 in the SRAM cell. Similarly, vias corresponding to via 24 are formed in the microprocessor section of the semiconductor chip at the same time and in the same process steps, the via 24 can be formed in the SRAM cell that extends from the contact 18 to the via 20 as shown with respect to FIGS. 5A-5C. Thus, the various process steps carried out to form the SRAM cell are carried out simultaneously with the same process steps being used to form transistors in the microprocessor section of the same semiconductor chip and additional particular steps need not be carried out in the SRAM cell.

FIG. 7 is a view of the layout showing the various nodes at the electrical circuit that form the 6T SRAM cell 10. The top metal line 30 is not shown so that the various nodes can more easily be seen. As will be appreciated, in the final SRAM cell, the metal line 30 is present, as are other overlying insulation and wiring layers in order to provide the electrical connection to the various nodes.

As shown in FIG. 7, the SRAM cell 10 includes the two storage nodes Q1 and Q2. These two storage nodes are electrically part of the contact 18 as shown in FIGS. 3A-6B. In particular, the metal contact 18 electrically connects the drain of transistor P1 to the drain of transistor N1, as can be seen in FIG. 7. Since transistors N1 and N3 are both N-channel transistors, they can share a common active area. The contact 18 is connected to this common active area. This will be the source of transistor N1 and can either be the source or the drain of transistor N3 depending on whether data is being written to or read from the data storage node Q1 to or from the bit line and the value of the data. As is known, the identification of a particular terminal of an MOS transistor as a source or a drain can change depending on the relative voltages at the two terminals and the operation of the MOS transistor. Also shown in FIG. 7 node Q2, which also has a contact 18 electrically connects the common active area of transistors N2 and N4 to the drain of transistor P2, as can be seen viewing FIG. 1A. The respective nodes $V_{g1}$ and $V_{g2}$ are also shown in FIG. 7 corresponding to those in FIG. 1A. The various connections to outside of the memory cell are labeled, but the electrical lines connecting them are not shown, to avoid obscuring the structure of the cell itself. In particular, the electrical connections for VSS and VDD are shown with the labels, as are connections to the bit line and bit line bar and the word line.

FIG. 8A to 10B show an alternative embodiment for forming an enlarged via 42 as will now be described.

Figure 8B:
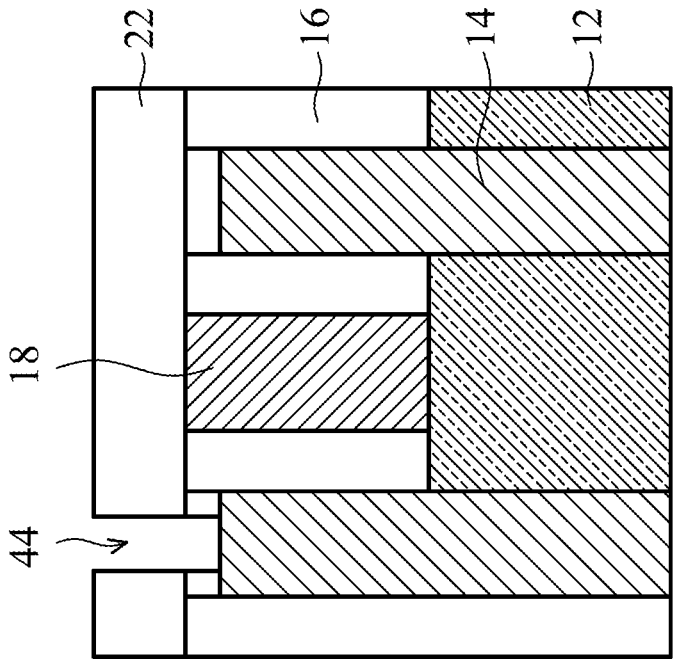
FIG. 8B is a cross-section view taken along lines 8B-8B of FIG. 8A.
Figure 8A:
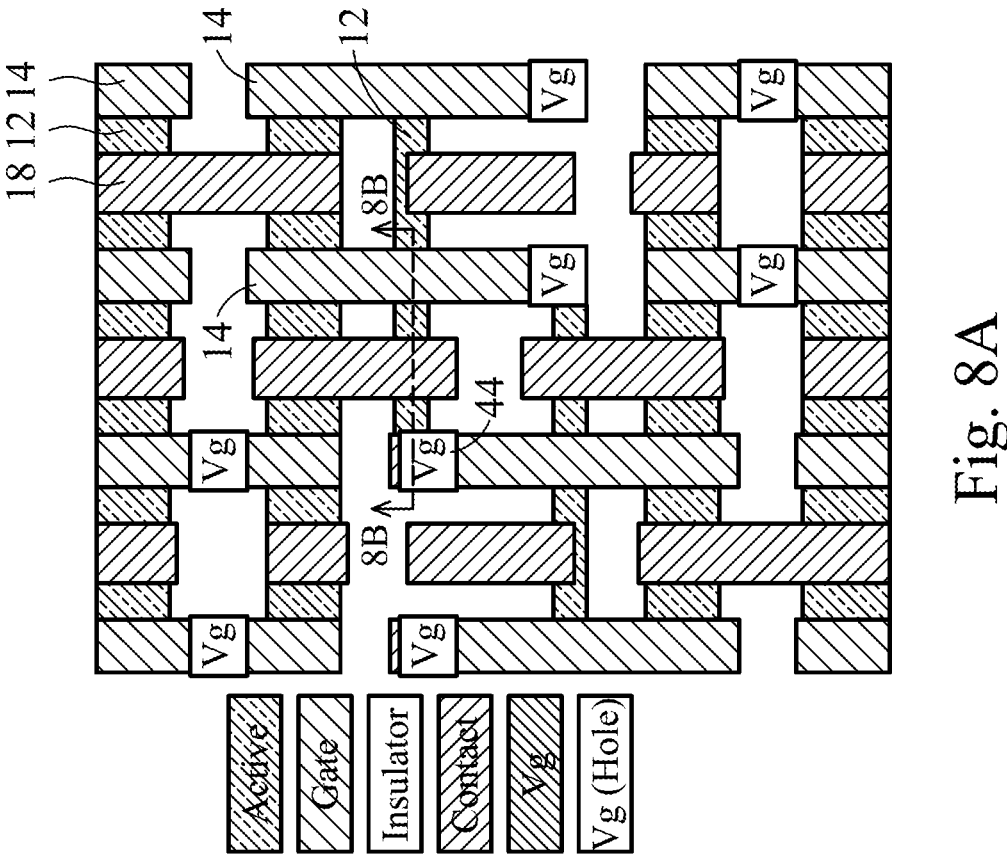
FIG. 8A is a top side view of the layout of steps in manufacturing the SRAM memory cell according to an alternative embodiment disclosed herein.

FIG. 8A is a top side view of the layout of steps in manufacturing the SRAM memory cell according to this alternative embodiment. FIG. 8B is a cross-section view taken along lines 8B-8B of FIG. 8A.

When the structure is in the state as shown in FIG. 3B, the insulation layer 22 is deposited. After this, a hole 44 is etched for a via to be formed later. The hole 44 might also be called a recess, blind hole, opening or other name that indicates that access to the gate 16 is provided through layer 22. This hole 44 is etched through to reach the gate 14 and is left as an open hole, as shown in FIGS. 8A and 8B, as also noted in the legend of 8A. This may require two or three different etch chemistries, since different layers are present, but it can be done with a single pattern and mask step.

Figure 9B:
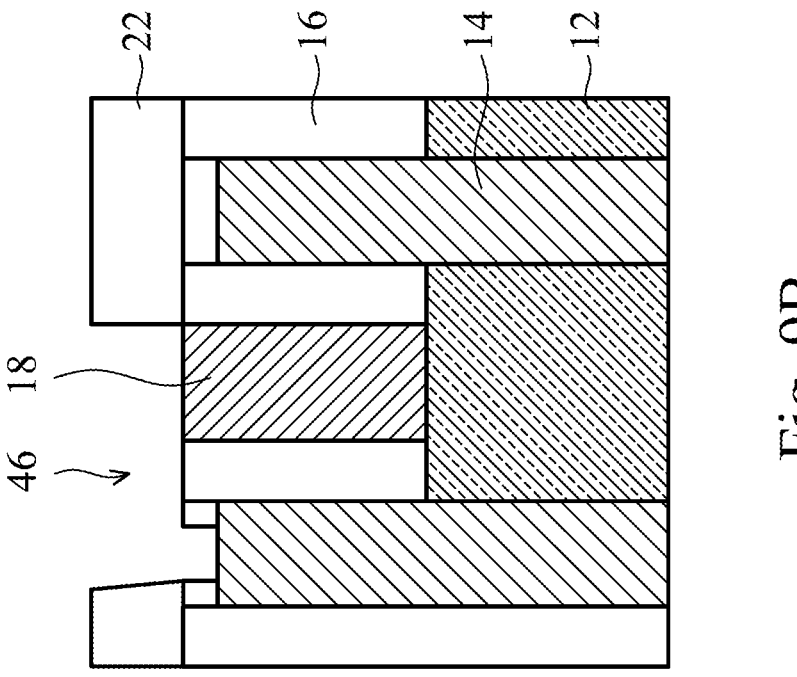
FIG. 9B is a cross-section view taken along lines 9B-9B of FIG. 9A.
Figure 9A:
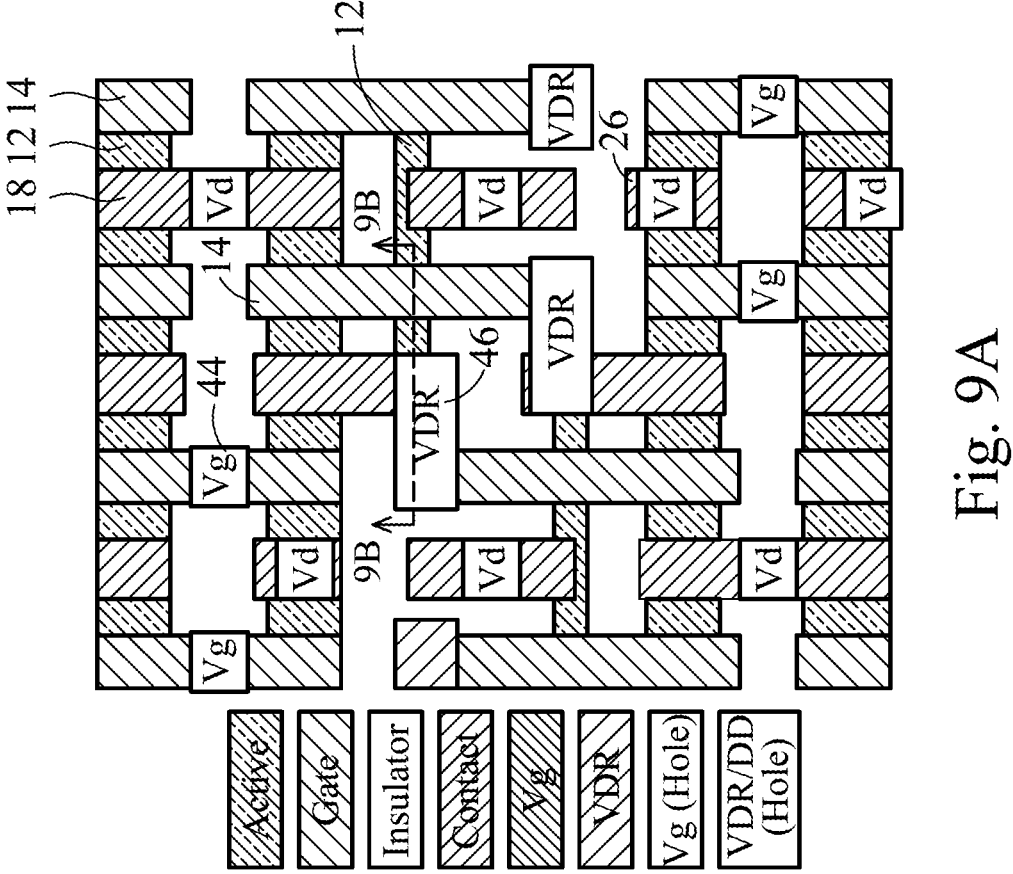
FIG. 9A is a top side view of the layout of steps in manufacturing the SRAM memory cell according to the alternative embodiment of FIG. 8A.

After this a second etch is carried out as shown in FIGS. 9A and 9B. This second etch is carried out by doing a further pattern and mask set to provide an opening over the contact 18, as shown in 9B. An etch is carried out to create the hole 46. The hole 46 might also be called a recess, blind hole, opening or other name that indicates that access to the gate 16 is provided through layer 22. As can be seen, this hole 46 includes within it the prior hole 44. However, the etch chemistry does not etch the insulator 16. In one embodiment, there is an etch stop layer, such as Ti or TiN or other suitable etch stop layer material overlying the insulator 16 and the etch can stop on this layer to create the hole 46 as shown.

In an alternative embodiment, it is possible to not perform the pattern, mask and etch to form hole 44 and instead just carry out the single step of forming hole 46. Since hole 46 includes all of hole 44, it is possible to save a series of pattern, mask and etch steps and just etch hole 46 and not etch hole 44 at all. In this alternative embodiment, the etch chemistry is selected to etch all layers present overlying the gate 16. Therefore, that portion of the insulator 16 that is between the contact 18 and the gate 16 will be etched and the structure will look somewhat different from that shown in FIG. 9B. It is acceptable in some embodiments to remove the insulator between the contact 18 and the gate 16 since the goal of via metal 42 is provide a low resistance electrical connection between the two structures and the removal of additional insulation will provide large surface contact between them and via metal 42.

Figure 10B:
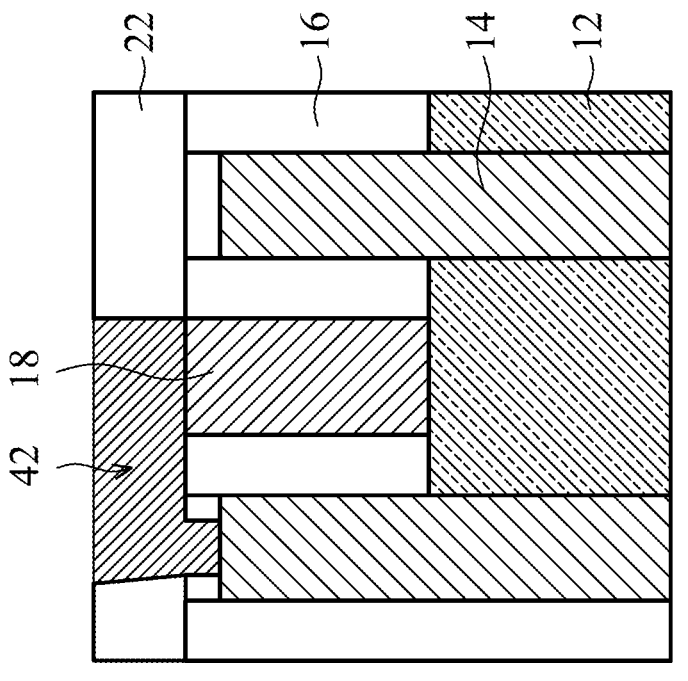
FIG. 10B is a cross-section view taken along lines 10B-10B of FIG. 10A.
Figure 10A:
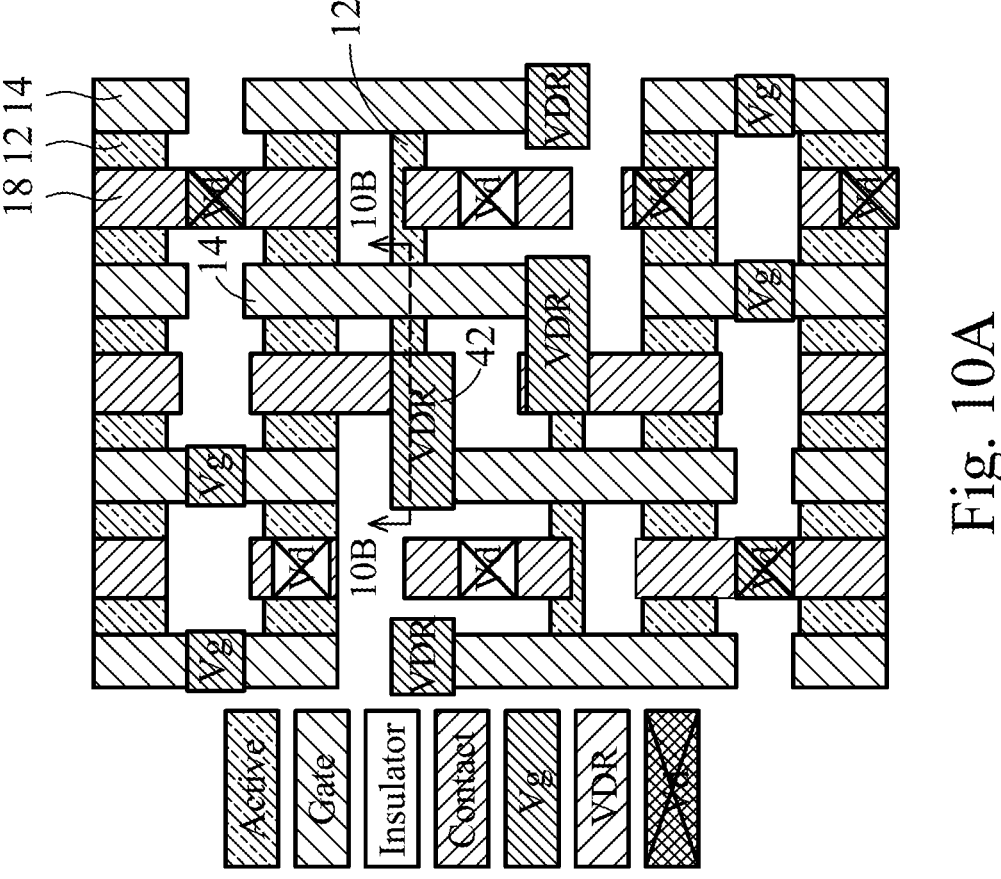
FIG. 10A is a top side view of the layout of steps in manufacturing the SRAM memory cell according to the alternative embodiment of FIG. 8A.

FIG. 10A is a top side view of the layout of steps after hole 46 is etched. A metal is deposited to form the metal via 42 that fills both holes 44 and 46 at the same time. In this embodiment, this is done in a single series of metal deposition steps rather than the two different series as shown and described with respect to FIGS. 4A-5C. In this alternative embodiment, only a single metal deposition process is carried out and the same metal is a single, integrated, continuous metal member from the contact 18 to the gate 16. This will provide for even lower resistance of the connection between them, as shown in FIG. 10B.

As can be seen, a compact SRAM cell is constructed in which the elements can be placed very close to each other to provide a smaller footprint of the memory cell than was previously possible. Rather than using a metal wiring layer to electrically connect a contact to the gates of other transistors, a via is formed that electrically connects the contact of the storage node of one transistor to the common gates of the other transistors for the other storage node. The use of an enlarged via, that overlays prior vias and extends to a contact, provides significant savings in space for forming electrical connections within the memory cell, thus permitting a more compact memory cell than was previously possible.

In FIG. 7, the extended via 24 is shown that corresponds to the one shown in FIG. 6B. Specifically, as can be seen, the via 24 of FIG. 7 extends from the contact 18 of Q1 to the gate 14 that contains node $V_{g1}$ that is part of the common gate for transistors P2 and N2. Similarly, another via 24 electrically connects the node Q2 of contact 18 to the other pair of transistors to the common gate connection $Vg_2$ for P1 and N1. Therefore, the use of the extended via 24 avoids the use of a metal wiring layer to carry out the electrical connection between the various internal nodes of the transistors of the 6T SRAM memory cell, permitting a more compact cell and thus resulting in a cell with a smaller area and smaller footprint.

The present disclosure in various embodiments provides a compact 6T SRAM cell with interconnections that provides a small area footprint of an SRAM cell. In the compact SRAM cell a common gate is provided for a first pair of transistors that is coupled to an electrically coupled drain of a second pair of transistors. The second pair of transistors has a common gate that is coupled to an electrically coupled drain of the first pair of transistors, thus cross-coupling the two pairs of transistors to each other. An expanded metal via extends from the drain of one transistor to the common gate of the first pair of transistors to provide the electrically coupling, thus achieving a memory cell that is more compact than previously possible. The use of a metal via that extends from the drain of one transistor to the common gate of two transistors provides significant savings in space, mask layers and process steps. It avoids the need to use of one or more metal wiring layer for the cross couple connection, which not only makes the cell more compact, but reduces the stray capacitance that would occur if a metal wiring layer or layers had to provide the functions of connecting one or more voltage supplies to the memory cell while also providing cross couple connection.

This layout of the SRAM cell disclosed removes two metal wiring strips from the memory cell, permitting the cell to become more compact. There is practical limit to how close one metal wiring strip can be to an adjacent strip because they might short to each other if they get to close and the capacitance is increase the closer the strips get to each other. By using a via that is in different insulating layer than the metal wiring layer, the components of the cell can be closer to each other and avoid the potential for shorting or capacitive cross coupling.

According to one embodiment, an integrated circuit structure has a substrate and a semiconductor active area overlying that substrate. A first gate is overlying a first channel region in the active area. A first transistor is formed that includes the first channel region, a first source region adjacent to a first side of the channel in the active area, a first drain region adjacent to a second side of the channel region and the first gate. A metal contact is directly connected to the first drain region of the first transistor and a second gate is positioned spaced from the first gate. The second gate is overlying a second channel region. A second transistor that includes the second channel region, a second source region adjacent to a first side of the second channel in the active area, a second drain region adjacent to a second side of the second channel region and the second gate is formed in the circuit. A metal via is directly connected to the second gate. Above this an expanded metal via that overlays the metal contact and the metal via electrically connect them to each other, the expanded metal via extending in a plane from the metal contact to the metal via. A first electrical insulation layer surrounds the expanded metal via.

In one embodiment, the insulation structure that overlays the semiconductor active area is positioned to surround the first gate and the second gate. The metal contact is positioned between the first gate and the second gate. In a further embodiment the metal contact is surrounded by the insulation structure.

In one embodiment an SRAM cell is formed by having a third transistor and fourth transistor in which the first gate overlays a third channel region of the third transistor and the second gate overlays a fourth channel region of the fourth transistor and a drain of the third transistor is electrically coupled to first gate to form a pair of cross-coupled invertors, which create an SRAM cell. In other embodiments, a pair of access of transistors are connected to the storage nodes to provide a full 6T SRAM cell.

In one embodiment, a second electrical insulation layer is overlying the expanded metal via and the first electrical insulation layer. A metal wiring layer is overlying the first electrical insulation layer. The metal wiring layer is positioned spaced from the expanded metal via in contact with the first electrical insulation layer and surrounded by the second electrical insulation layer.

In yet a further embodiment, an integrated circuit structure has a semiconductor active area. There is a gate overlying a channel region in the active area of a transistor that includes the channel region and a first terminal adjacent to a first side of the channel in the active area. A conductive contact is electrically coupled to the first terminal of the first transistor. A conductive member is spaced from the first gate. A first conductive via is electrically coupled to the conductive member. A second conductive via is positioned to overlie the conductive contact and the first conductive via, the second conductive via electrically coupling the conductive contact to the first conductive via to provide electrical coupling from the first terminal of the transistor to the conductive member.

In one embodiment, this connection used to provide a compact structure for connecting a common gate one pair of transistors to the drain of another transistor. In this embodiment the first terminal is the drain of the transistor.

In one embodiment, the gate has a first height overlying the active area and the conductive contact has a second height overlying the active area and the second height is greater than the first height. This permits the second conductive via to extend from the conductive contact to the first conductive via to overlay conductive contact, the first conductive via and the second gate. This structure can be used in a FinFet transistor as well as other structures.

The structure can be formed by the following method steps. An active area of a semiconductor is formed and then a gate is formed overlying the active area. An insulating structure is formed over the active area and the gate. There is an etch of an opening in the insulating structure spaced from the gate, the opening exposing the active area in a region spaced from the gate. A first conductive material is deposited in the opening to provide an electrical connection to the active area. A first insulating layer is deposited over the insulating structure and the first conductive material and then there is an etching an opening in the first insulating layer, the opening being spaced from the first conducive material and the opening exposing a conductive structure that is spaced from the first conductive material. A second conductive material is then deposited in the opening that is electrically coupled to the conductive structure and a second insulating layer is deposited positioned over the first insulating layer, the first conductive material and the second conductive material. An opening is then etched in the second insulating layer, the opening extending from the first conductive material to the second conductive material and a third conductive material is deposited in the opening that extends from the first conductive material to the second conductive that electrically couples the active area in a region spaced from the gate to the conductive structure.

In one embodiment, the structure created has gate of first gate of a first transistor and the active area it overlays as a first channel region of the first transistor and the first conductive material electrically connects to a drain of the first transistor. The conductive structure is a second gate that overlays a second active area of a second transistor and the third conductive material electrically connects the drain of the first transistor to the second gate of the second transistor.

In one embodiment, each of the first, second and third conductive materials comprise tungsten.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit structure comprising:
   a substrate;
   a first semiconductor active area overlying the substrate;

a second semiconductor active area offset from the first semiconductor active area in a first direction;

a first gate overlying a first channel region in the second semiconductor active area;

a first transistor that includes the first channel region, a first source region adjacent to a first side of the first channel region in the second semiconductor active area, a first drain region adjacent to a second side of the first channel region and the first gate;

a conductive contact that is directly connected to the first drain region of the first transistor, the conductive contact being a first conductive material;

a second gate spaced from the first gate, the second gate directly adjacent to the first drain region of the first transistor, an upper surface of the second gate being lower than an upper surface of the conductive contact;

an expanded conductive via including:

a first conductive portion that extends in a plane from the conductive contact to the second gate; and a second conductive portion that extends downward from the first conductive portion and is directly connected to the second gate, the second conductive portion being the same material as the first conductive portion; and a first electrical insulation layer that surrounds the expanded conductive via.

2. The integrated circuit structure of claim 1, wherein the second conductive portion and the first conductive portion are a continuous layer.

3. The integrated circuit structure of claim 1, wherein the first conductive material and a second conductive material of the expanded conductive via are different.

4. The integrated circuit structure of claim 1, further comprising:

an insulating structure surrounding the conductive contact.

5. The integrated circuit structure of claim 4, wherein the insulating structure is a first dielectric material and the first electrical insulation layer is a second dielectric material that is different from the first dielectric material.

6. The integrated circuit structure of claim 1, further comprising:

a second electrical insulation layer overlying the expanded conductive via and the first electrical insulation layer.

7. The integrated circuit structure of claim 6, further including a conductive wiring layer overlying the first electrical insulation layer.

8. The integrated circuit structure of claim 7, wherein the conductive wiring layer is positioned spaced from the expanded conductive via in contact with the first electrical insulation layer and surrounded by the second electrical insulation layer.

9. The integrated circuit structure of claim 1, wherein the second gate is directly adjacent to the first drain region of the first transistor with no gate intervening therebetween.

10. A device, comprising:

a first semiconductor active area;

a first gate directly adjacent to the first semiconductor active area;

a conductive contact that is electrically coupled to the first semiconductor active area;

an expanded conductive via that overlays the conductive contact, the expanded conductive via including:

a first conductive portion that extends in a plane from the conductive contact to the first gate; and a second conductive portion that extends downward from the first conductive portion and is directly connected to the first gate, the second conductive portion being the same material as the first conductive portion;

a first electrical insulation layer that surrounds the expanded conductive via;

a second semiconductor active area offset from the first semiconductor active area in a first direction;

a first channel region formed by the first gate overlying the second semiconductor active area;

a second gate overlying a second channel region of the first semiconductor active area, the second gate offset from the first gate in a second direction, the second direction being perpendicular to the first direction; and a first transistor that includes the first channel region, a first source region adjacent to a first side of the first channel region in the second semiconductor active area, and a first drain region adjacent to the second side of the first channel region and the first gate.

11. The device of claim 10, further comprising:

an electrical insulating structure surrounding the conductive contact.

12. The device of claim 11, wherein the electrical insulating structure is a first dielectric material and the first electrical insulation layer is a second dielectric material that is different from the first dielectric material.

13. The device of claim 10, further comprising:

a second transistor that includes the second channel region, a second source region adjacent to a first side of the second channel region in the first semiconductor active area, a second drain region adjacent to the second side of the second channel region and the second gate, the second drain region of the first semiconductor active area being electrically coupled to the conductive contact.

14. The device of claim 13, further comprising:

a third transistor and a fourth transistor in which the second gate overlays a third channel region of the third transistor and the first gate overlays a fourth channel region of the fourth transistor, and wherein a drain of the third transistor is electrically coupled to the second gate and a drain of the fourth transistor is electrically coupled to the first gate to form a pair of cross-coupled inverters that provide an SRAM cell.

15. A device, comprising:

a first semiconductor active area;

a first gate overlapping a second semiconductor active area offset from the first semiconductor active area;

a first channel region formed by the first gate overlying the second semiconductor active area;

a conductive contact that is directly connected to the first semiconductor active area, the conductive contact formed of a first conductive material;

an expanded conductive via that overlays the conductive contact and directly contacts the first gate, electrically coupling the first semiconductor active area to the first gate, the expanded conductive via including:

a first conductive portion that extends in a plane from the conductive contact to the first gate; and a second conductive portion that extends downward from the first conductive portion and is directly connected to the first gate, the second conductive portion being the same material as the first conductive portion;

a second gate overlying the first semiconductor active area forming a second channel region, the second gate being directly adjacent to a first drain region of the first semiconductor active area;

a first electrical insulation layer that surrounds the expanded conductive via; and a first transistor that includes the first channel region, a source region adjacent to a first side of the first channel region in the second semiconductor active area, and a second drain region adjacent to a second side of the first channel region and the first gate.

16. The device of claim 15, further comprising:

an insulation structure surrounding the conductive contact.

17. The device of claim 16, further comprising:

an etch stop layer between the insulation structure and the first electrical insulation layer, the etch stop layer having an opening overlying the first gate.

18. The device of claim 15, wherein each of the first and second conductive materials includes tungsten.

19. The device of claim 15, wherein the first conductive material is different than a second conductive material of the expanded conductive via.

20. The device of claim 15, comprising:

a second transistor that includes the second channel region, a source region adjacent to a first side of the second channel region in the first semiconductor active area, and the first drain region adjacent to a second side of the second channel region and the second gate.

\*   \*   \*   \*   \*